US007898325B2

(12) United States Patent
Hasan Abrar

(10) Patent No.: US 7,898,325 B2
(45) Date of Patent: Mar. 1, 2011

(54) AMPLIFIER WITH BYPASS SWITCH

(75) Inventor: Zulfa Bin Hasan Abrar, Penang (MY)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 96 days.

(21) Appl. No.: 12/473,351

(22) Filed: May 28, 2009

(65) Prior Publication Data

US 2010/0301942 A1    Dec. 2, 2010

(51) Int. Cl.
*H03F 1/14* (2006.01)
(52) U.S. Cl. .......................................... 330/51
(58) Field of Classification Search ............. 330/51, 330/151, 282, 302, 310
See application file for complete search history.

(56) References Cited

U.S. PATENT DOCUMENTS

| 6,838,933 | B2 | 1/2005 | Goyette et al. | |
|---|---|---|---|---|
| 6,864,743 | B2 | 3/2005 | Pozdeev | |
| 6,930,546 | B2 | 8/2005 | Floyd | |
| 7,388,428 | B2 * | 6/2008 | Wiegner et al. | 330/86 |
| 2009/0015335 | A1 | 1/2009 | Floyd | |
| 2009/0096527 | A1 | 4/2009 | Ishiguro | |

FOREIGN PATENT DOCUMENTS

WO    WO0215397 A2    2/2002

OTHER PUBLICATIONS

Avago Technologies, Inc., "MGA-72543: PHEMT* Low Noise Amplifier with Bypass Switch", www.avagotech.com, May 23, 2008, pp. 1-21.
Avago Technologies, Inc., "MGA-645T6: Low Noise Amplifier iwth Bypass/shutdown Mode in Low Profile Package", www.avagotech.com, Jan. 30, 2007, pp. 1-15.

* cited by examiner

*Primary Examiner*—Robert Pascal
*Assistant Examiner*—Khiem D Nguyen

(57) ABSTRACT

An amplifying circuit of a receiver for receiving a signal in a wireless network includes an amplifier and a switch. The amplifier includes an amplifying transistor having a gate connected to an input for receiving the signal and a source/drain connected to a voltage source through an inductance. The amplifier also includes a bypass transistor having a gate connected to a control signal for activating the bypass transistor in a bypass mode and a source/drain connected in parallel with the inductance. The switch is connected in parallel with the amplifier between the input and an output, and activates in the bypass mode, enabling the received signal to bypass the amplifier. In the bypass mode, a voltage at the source/drain of the amplifying transistor is lower when the bypass transistor is activated than when not activated, the lower source/drain RF voltage reducing unwanted harmonics from the amplifier.

20 Claims, 5 Drawing Sheets

AMPLIFIER WITH BYPASS SWITCH

BACKGROUND

Mobile wireless devices include receiver circuits for receiving various signals, such as radio frequency (RF) signals, by way of base stations or other transmitters in the wireless network. Because the RF signals often have low power (e.g., low received signal strength), high noise and thus low signal-to-noise ratios, the receiver circuit of a wireless device includes an amplifier, such as a low noise amplifier (LNA), configured to receive and amplify the received RF signals. However, there are circumstances in which the received signal has particularly high received signal strength, for example, when the wireless device is in close proximity to the transmitting base station. When the received signal strength is particularly high, amplification of the RF signal is not necessary and potentially harmful to the receiver circuit. Therefore, the wireless device may also include power control in the amplifier circuit to prevent the receiver circuit from becoming saturated by the high received signal strengths of the RF signals.

One type of power control amplifier circuit includes a bypass switch, which enables a bypass mode parallel to an amplify mode. FIG. 1 is a block diagram of a conventional amplifier circuit 100, which includes amplifier 110 and bypass switch 130 connected in parallel.

Referring to FIG. 1, the amplifier 110 includes common source amplifiers, respectively including first transistor 111 and second transistor 112. A gate of the first transistor 111 is connected to node N 103, which is connected to signal input 132 through capacitor C102 and first bias circuit 151 through resistor R101. A source of the first transistor 111 is connected to a ground voltage and a drain of the first transistor 111 is connected to node N 106 through inductor L101. Node N106 is also connected to voltage source V150, the ground voltage through capacitor C104, and first and second bias circuits 151 and 152. A gate of the second transistor 112 is connected to the drain of the first transistor 111 through capacitor C101. A source of the second transistor 112 is connected to the ground voltage. A drain of the second transistor 112 is connected to node N105, which is connected to node N106 through inductor L102, the second bias circuit 152 through resistor R102, and the signal output 134 through capacitor 103.

The bypass switch 130 is connected between the signal input 132 and the signal output 134. The switch 130 activates (closes) in the bypass mode, so that the RF signal entering the signal input 132 bypasses the amplifier 110. The bypass switch 130 deactivates (opens) in the amplify mode, so that the RF signal entering the signal input 132 is amplified by the amplifier 110. The amplified RF signal is output at the signal output 134.

However, even when operating in the bypass mode, the high signal strength RF signal received at the signal input 132 modulates the gate of the first transistor 111, thus partially turning it on. The first transistor 111 therefore amplifies the input RF signal, and subsequently drives the second transistor 112, which generates unwanted harmonics at the signal output 134 that degrade the overall performance in the bypass mode. Further, parasitics of the amplifier 110 may interfere with circuitry of the bypass switch 130, resulting in a dip in insertion loss occurring within frequency of operation, discussed below.

For example, when the first and second transistors 111 and 112 are in an off state (in the bypass mode), the first parasitic gate-drain capacitance Cgd1 of the first transistor 111 forms a first leakage path (not shown) from the transistor input at its gate to the transistor output at its drain, and the second parasitic gate-drain capacitance Cgd2 of the second transistor 112 likewise forms a second leakage path (not shown) from the transistor input at its gate to the transistor output at its drain. This results in RF signal "leakage" through the deactivated amplifier 110 through the bypass switch 130. Furthermore, the first parasitic gate-drain capacitance Cgd1 in combination with inductor L101 creates a resonance, and a dip in the insertion loss of the bypass switch 130 occurs at this resonance frequency. Depending on the values of the first parasitic gate-drain capacitance Cgd1 and inductor L101, the insertion loss dip may fall within the frequency of operation of the amplifier circuit 100, as shown for example by curve 521 in FIG. 5.

FIG. 2 is a block diagram of a conventional amplifier circuit 200, which includes amplifier 210 having a cascode configuration and bypass switch 230 connected in parallel with the amplifier 210.

For example, the amplifier 210 includes a common source amplifier followed by a common gate amplifier to provide amplification, shown by cascoded first transistor 211 and second transistor 212, respectively. A gate of the first transistor 211 is connected to node N203, which is connected to signal input 232 through capacitor C201 and bias circuit 251 through resistor R201. A source of the first transistor 211 is connected to a ground voltage and a drain of the first transistor 211 is connected to a source of the second transistor 212. A gate of the second transistor 212 is connected to node N205, which is connected to the bias circuit 251 through resistor R202. A drain of the second transistor 212 is connected to signal output 234, which is also connected to node N206 through inductor L201. The node N206 is further connected to the ground voltage through capacitor C204, the bias circuit 251 and voltage source V250. The voltage source V250 must provide a relatively high voltage (e.g., 3.0V), in order to for the amplifier circuit 200 to operate in the cascode configuration.

The bypass switch 230 is connected between the signal input 232 and the signal output 234. The bypass switch 230 activates (closes) in the bypass mode, so that the RF signal entering the signal input 232 bypasses the LNA 210. The switch 230 deactivates (opens) in the amplify mode, so that the RF signal entering the signal input 232 is amplified by the LNA 210. The amplified RF signal is output at the signal output 234.

In the cascode configuration shown in FIG. 2, the first and second transistors are turned off in the bypass mode. However, the gate of the first transistor 211 is modulated by the input signal, generating a drain current that drives the source of the second transistor 212. However, since the source of the second transistor 212 has relatively low impedance, the voltage swing at the drain of the first transistor 211 is minimal, thus reducing harmonic induced by the nonlinear drain-source capacitance (Cds), which improves performance in the bypass mode over a conventional amplifier circuit having common source amplifiers (e.g., amplifier circuit 100 shown in FIG. 1).

However, the cascode configuration of the amplifier circuit 200 has disadvantages. For example, low voltage supply cannot be used since the first and second transistors 211 and 212 are stacked and share a single drain supply. Also, output impedance of the cascode amplifier circuit 200 is very reactive and varies with the frequency of operation, thus making broadband output match very difficult, unless lossy match is employed.

SUMMARY

In a representative embodiment, an amplifier circuit of a receiver for receiving a signal in a wireless network includes an amplifier and a switch. The amplifier includes an amplifying transistor and a bypass transistor. The amplifying transistor has a gate connected to an input for receiving the signal and a source/drain connected to a voltage source through an inductance, and the bypass transistor has a gate connected to a control signal for activating the bypass transistor in a bypass mode and a source/drain connected between the voltage source and the source/drain of the amplifying transistor in parallel with the inductance. The switch is connected in parallel with the amplifier between the input and an output, the switch being configured to activate in the bypass mode, enabling the received signal to bypass the amplifier. In the bypass mode, an RF voltage at the source/drain of the amplifying transistor is lower when the bypass transistor is activated than when the bypass transistor is not activated, the lower source/drain RF voltage reducing unwanted harmonics from the amplifier.

In another representative embodiment, a radio frequency (RF) amplifying circuit includes an amplifier connected between a signal input and a signal output, the amplifier being configured to amplify an RF signal received through the signal input and to output the amplified RF signal through the signal output in an amplify mode. The RF amplifying circuit further includes a switch connected in parallel with the amplifier between the signal input and the signal output, the switch being configured to deactivate in the amplify mode and to activate in a bypass mode, and being further configured to attenuate the RF signal received through the signal input in the bypass mode. The amplifier includes a first amplifying transistor having a first gate connected to the signal input, a first source connected to a ground voltage, and a first drain connected to a voltage source through an inductor, the inductor having an inductor impedance; and a variable impedance circuit connected between the first drain and the voltage source in parallel with the inductor, the variable impedance circuit having a first impedance greater than the inductor impedance in the amplify mode and has a second impedance less than the inductor impedance in the bypass mode.

In another representative embodiment, an amplifying circuit of a receiver for receiving an RF signal through a signal input includes first second and third field effect transistors (FETs). The first FET includes a first gate connected to the signal input, a first drain connected to a first node, and a first source connected to a ground voltage, the first node being connected to a second node through a first inductor and the second node being connected to a voltage source. The second FET includes a second gate connected to the first node, a second drain connected to a signal output, and a second source connected to the ground voltage, the first and second FETs amplifying the RF signal in an amplify mode. The third FET includes a third gate connected to an inverter which inverts a control signal, the third FET being connected in series between the first node through a first capacitor and the second node through a second capacitor, and connected in parallel to the first inductor. A bypass switch is connected between the signal input and the signal output, the bypass switch being configured to activate in a bypass mode to attenuate the RF signal received from the signal input, and to prevent the first and second FETs from amplifying the RF signal.

BRIEF DESCRIPTION OF THE DRAWINGS

The example embodiments are best understood from the following detailed description when read with the accompanying figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, representative embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The various embodiments improve performance of an amplifier circuit in a bypass mode. The improved performance includes, for example, increased large signal linearity and better insertion loss performance of a bypass switch activated in the bypass mode.

Figure 3:
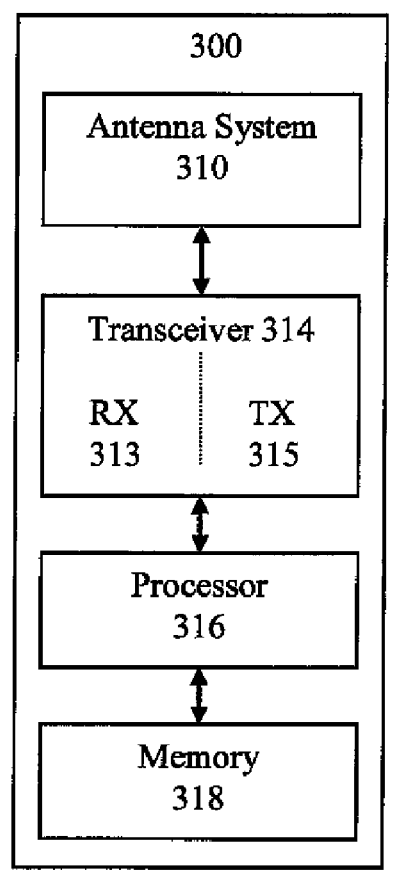
FIG. 3 is a block diagram illustrating a wireless device, according to a representative embodiment.

FIG. 3 is a functional block diagram of representative wireless device 300, configured to communicate over a wireless network with base stations, access points, etc., using any network standards, such a Universal Mobile Telecommunications System (UMTS), Global System for Mobile communications (GSM), Enhanced Data rates for GSM Evolution (EDGE), General Packet Radio Service (GPRS), WiFi (IEEE 802.11), WiMax (IEEE 802.16), and the like, according to various embodiments. The wireless device 300 may be cellular telephone, for example, although it is representative of any wireless device configured for communication over the wireless network, including personal digital assistants (PDA), portable computers and the like.

Representative wireless device 300 includes transceiver 314, processor 316, memory 318 and antenna system 310. The transceiver 314 includes a receiver 313 and a transmitter 315, and provides functionality for the wireless device 300 to communicate with other devices over the wireless network according to the appropriate standards. The processor 316 is configured to execute one or more software algorithms, including a bypass algorithm of the various embodiments described herein, and to provide control functionality in conjunction with the memory 318 to provide the functionality of wireless device 300. The processor 316 may include its own memory (e.g., nonvolatile memory) for storing executable software code that allows it to perform the various functions of wireless device 300, discussed herein. Alternatively, the executable code may be stored in designated memory locations within the memory 318. The antenna system 310 may include any of various types of antenna systems suitable for the wireless device 300, including an omni-directional antenna system or a directional antenna system, such as a beam-steering antenna, a beam-switching antenna or an antenna array.

As will be appreciated by those skilled in the art, one or more of the various "parts" shown in FIG. 3 may be physically implemented using a software-controlled microprocessor, hard-wired logic circuits, or a combination thereof. Also, while the parts are functionally segregated in the wireless device 300 for explanation purposes, they may be combined variously in any physical implementation.

Figure 4:
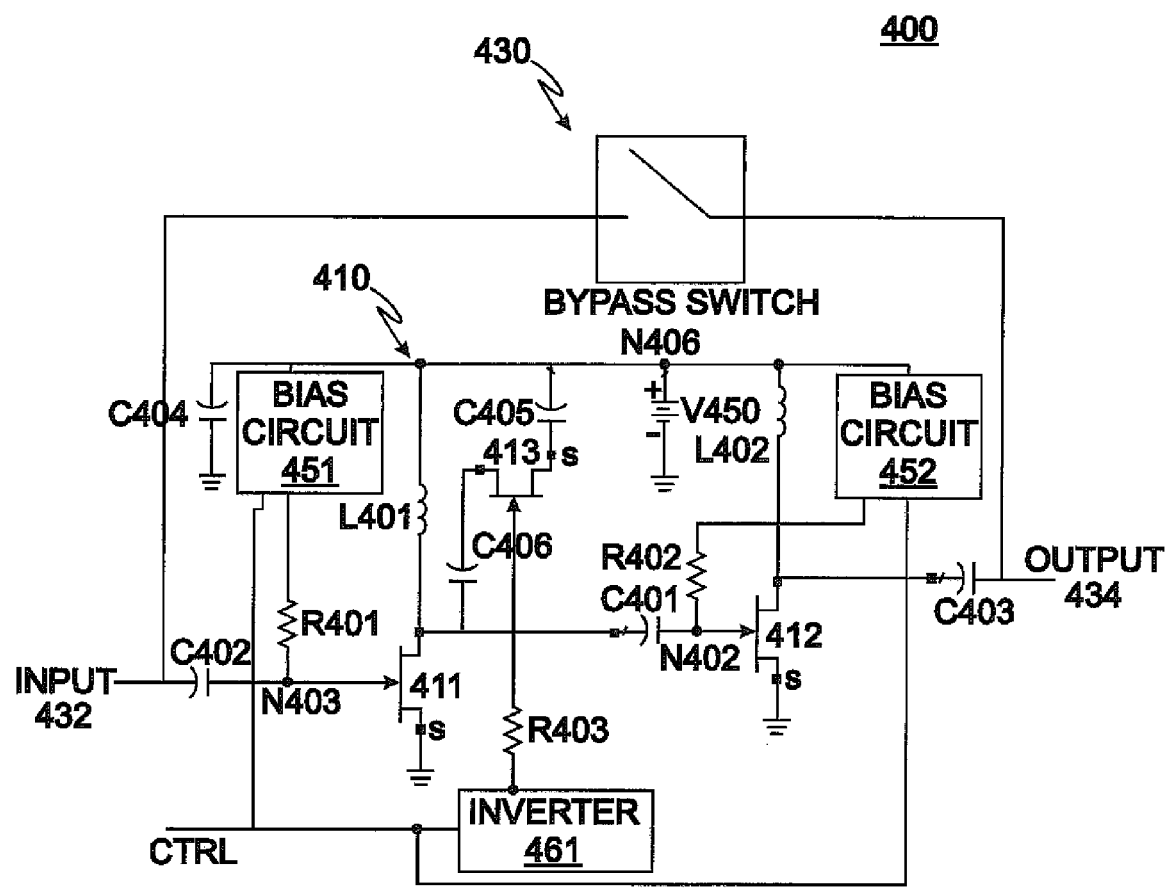
FIG. 4 is a block diagram illustrating an amplifier circuit, according to a representative embodiment.

FIG. 4 is a block diagram illustrating an amplifier circuit, according to a representative embodiment. In particular, FIG. 4 shows amplifier circuit 400, which includes amplifier 410 and bypass switch 430 connected in parallel. The amplifier circuit 400 may be included, for example, in the receiver 313 of the representative mobile device 300 shown in FIG. 3, although the amplifier circuit 400 alternatively may be included in the antenna system 310 or in a separate amplifying circuit between the antenna system 310 and the receiver 313.

Generally, the amplifier circuit 400 operates in an amplify mode when the bypass switch 430 is deactivated or off (open), so that an RF signal received through the signal input 432 is amplified by the amplifier 410, and output at the signal output 434. Although the received signal is referred to herein as an RF signal, for purposes of explanation, it is understood that the received signal in various embodiments may include any other type or frequency of signal, without departing from the scope of the present teachings.

The amplifier circuit 400 operates in a bypass mode when the bypass switch 430 is activated or on (closed), so that the RF signal received through the signal input 432 bypasses the amplifier 410. For example, the processor 316 of FIG. 3 may continuously or periodically compare the power (e.g., received signal strength) of the RF signal with a threshold signal strength, and to activate the bypass switch 430 whenever the received signal strength exceeds the threshold signal strength (e.g., when the mobile device 300 is in close proximity with a base station transmitting the particular RF signal), as discussed below. In an embodiment, the RF signal is also attenuated by an insertion loss of the bypass switch 430 in the bypass mode, to reduce the high signal strength to a lower level, e.g., that will not saturate or damage the receiver circuits.

The amplifier 410 may be a low noise amplifier (LNA), for example, although other types of amplifiers may be incorporated into various embodiments, without departing from the scope of the present teachings. The amplifier 410 includes common source amplifiers, respectively including first transistor 411 and second transistor 412. The second transistor 412 is representative of transistor(s) configured to provide additional gain with respect to the initial gain provided by the first transistor 411. Thus, although a single second transistor 412 is depicted in FIG. 4, it is understood that the amplifier 410 may include multiple common source second transistors 412, or no second transistor 412, depending on the particular situation or application specific design requirements of various implementations, as would be apparent to one skilled in the art.

Referring to FIG. 4, a gate of the first transistor 411 is connected to node N403, which is connected to the signal input 432 through capacitor C402 and first bias circuit 451 through resistor R401. The first bias circuit 451 biases the first transistor 411 by an appropriate turn-on gate voltage, for example, when activated by control signal CTRL, discussed below. A source of the first transistor 411 is connected to a ground voltage and a drain of the first transistor 411 is connected to node N404. Node N404 is connected to node N406 through parallel circuit paths. One circuit path includes a first stage drain inductor L401 connected between nodes N404 and N406. The other circuit path includes a variable impedance circuit, which provides a first impedance that is higher than an impedance of the inductor L401 in the amplify mode (when the bypass switch 430 is deactivated) and which provides a second impedance that is lower than the impedance of the inductor L401 in a bypass mode (when the bypass switch 430 is activated). Node N406 is also connected to voltage source V450, the ground voltage through capacitor C404, and the first and second bias circuits 451 and 452.

In the depicted embodiment, the variable impedance circuit includes third transistor 413 connected in series between capacitors C405 and C406. In particular, the source (or the drain) of the third transistor 413 is connected to the capacitor C405 and the drain (or the source) of the third transistor 413 is connected to the capacitor C406. A gate of the third transistor 413 is connect to the control signal which deactivates (turns off) the third transistor 413 in the amplify mode and activates (turns on) the third transistor 413 in the bypass mode. In the depicted illustrative embodiment, the gate of the third transistor 413 is connected to inverter 461 to receive inverted control signal CTRL (e.g., provided by the processor 316 of FIG. 3), further discussed below. In other embodiments, any similar component(s) that provide the variable impedance may be substituted for the third transistor 413 connected in series between capacitors C405 and C406.

A gate of the second transistor 412 is connected to node N402, which is connected to the drain of the first transistor 411 through capacitor C401 and to the second bias circuit 452 through resistor R402. A source of the second transistor 412 is connected to the ground voltage. A drain of the second transistor 412 is connected to node N405, which is connected to node N406 through inductor L402 and to the signal output 434 through capacitor C403.

The bypass switch 430 in connected between the signal input 432 and the signal output 434. The bypass switch 430 activates or turns on (closes) in the bypass mode, so that the RF signal entering the signal input 432 bypasses the amplifier 410. The bypass switch 430 deactivates or turns off (opens) in the amplify mode, so that the RF signal entering the signal input 432 is amplified by the amplifier 410. In an embodiment, the bypass switch 430 is connected to inverter 461 (connection not shown), so that it is activated/deactivated in response to inverted control signal CTRL, along with the third transistor 413.

Further, the bypass switch 430 provides an insertion loss, which attenuates the RF signal in the bypass mode. For example, the bypass switch 430 may generate an insertion loss of about −2.0 dB to about −6.0 dB, depending in part on the frequency of the input RF signal. Therefore, the bypass switch 430 reduces the power or signal strength of the input RF signal, which further protects the receiver circuit from the high signal strength RF signals. In other words, in the bypass mode, the input RF signal is attenuated by the insertion loss of the bypass switch 430 instead of being amplified by the amplifier 410. Since the signal strength level of the input RF signal in the bypass mode may be higher than in the amplify mode, the bypass switch 430 is a high linearity switch, which may be measured in terms of Input 1 dB compression point (IP1 dB), which may be defined generally as the point at which the gain/loss is 1 dB less than the gain/loss at a lower input signal strength (the flat region). A higher IP 1 dB of the bypass switch 430 enables the receiver circuit to withstand the higher signal strength levels of the input RF signals without saturating subsequent receiver circuit stages.

In operation, the first bias circuit 451, the second bias circuit 452 and the inverter 461 receive the control signal CTRL (e.g., from processor 316 of FIG. 3). In the amplify mode, the control signal CTRL has a first voltage level (e.g., high level), which indicates that the received signal strength of the RF signal is less than (or equal to) the threshold signal strength, allowing normal operation of the amplifier 410. That is, the first and second transistors 411 and 412 of the amplifier 410 are activated in response to the control signal CTRL, and the inverter 461 inverts the control signal CTRL (e.g., to a low level), which deactivates the third transistor 413 and the bypass switch 430. In the bypass mode, the control signal CTRL has a second voltage level (e.g., low level), which indicates that the received signal strength of the RF signal is greater than the threshold signal strength, requiring bypass operation (and RF signal attenuation) to protect the receiver circuit. That is, the first and second transistors 411 and 412 are deactivated, and the inverter 461 inverts the control signal CTRL (e.g., to a high level), which activates the third transistor 413 and the bypass switch 430.

In the depicted embodiment, one control signal CTRL and inverter 461 are used to activate and deactivate the various components, for efficiency. However, it is understood that any arrangement of control signal(s) may be used to control operation of the amplifier circuit 400, without departing from the scope of the present teachings. For example, in an alternative embodiment, a first control signal may be used to activate/deactivate the first and second bias circuits 451 and 452 and/or the first and second transistors 411 and 412, while a separately generated second control signal may be used to activate/deactivate the bypass switch 430 and/or the third transistor 413.

Each of the first, second and third transistors 411, 412 and 413 (as well as the bypass switch 430, when implemented as a transistor) may be a field effect transistor (FET), such as a gallium arsenide field-effect transistor (GaAsFET), for example, although other types of FETs (and/or other types of transistors) within the purview of one of ordinary skill in the art may be incorporated into amplifier circuit 400, without departing from the scope of the present teachings. For example, the transistors may be high electron mobility transistors (HEMTs), pseudomorphic HEMTs, heterostructure FETs (HFETs), etc.

Further, it is understood that the terminals of the first, second and third transistors 411, 412 and 413 are designated sources and drains in FIG. 4 for convenience of explanation. As such, in various embodiments, the sources and drains may be reversed, without departing from the scope of the present teachings. Also, the first, second and third transistors 411, 412 and 413 may vary in size, although the particular size of each transistor may be adjusted to provide unique benefits for any particular situation or to meet various design requirements. For example, in an embodiment, the first and second transistors 411 and 412 may be the same size, as indicated by total gate width, for example, while the third transistor may be approximately one quarter the size of the first transistor 411.

Likewise, the capacitors, inductors and resistors in the amplifier circuit 400 may vary in size and value to provide unique benefits for any particular situation or to meet various design requirements. For example, referring to FIG. 4, capacitor C401 may have a value of about 3 pF, capacitors C402 and C403 may each have a value of about 2 pF, capacitor C404 may have a value of about 4 pF, and capacitors C405 and C406 may each have a value of about 3 pF. Inductors L401 and L402 may each have a value of about 3 nH. Also, resistor R401 may have a value of about 7 kΩ, resistor R402 may have a value of about 2 kΩ, and resistor R403 may have a value of about 3 kΩ.

In operation, assuming a voltage of about 1.4V DC is applied by the voltage source V450, the third transistor 413 is activated (turned on) in the bypass mode in response to inverted control signal CTRL. When it is turned on, the third transistor 413 acts as a small resistor, e.g., having a resistance of about 20Ω in the representative amplifier circuit described above, which appears in series with the capacitors C405 and C406. The variable impedance circuit therefore presents relatively low impedance in parallel with the inductor L401. That is, the combination of the resistance of the third transistor 413 and the capacitors C405 and C406 presents lower impedance to ground at the drain of the first transistor 411, resulting in lower RF voltage generated at the drain of first transistor 411 in the bypass mode (during periods of high signal strength input RF signals). The lower voltage drives the gate of the second transistor 412, and thus reduces unwanted harmonics generated by the second transistor 412 that would otherwise degrade the IP1 dB of the bypass switch 430.

Figure 1:
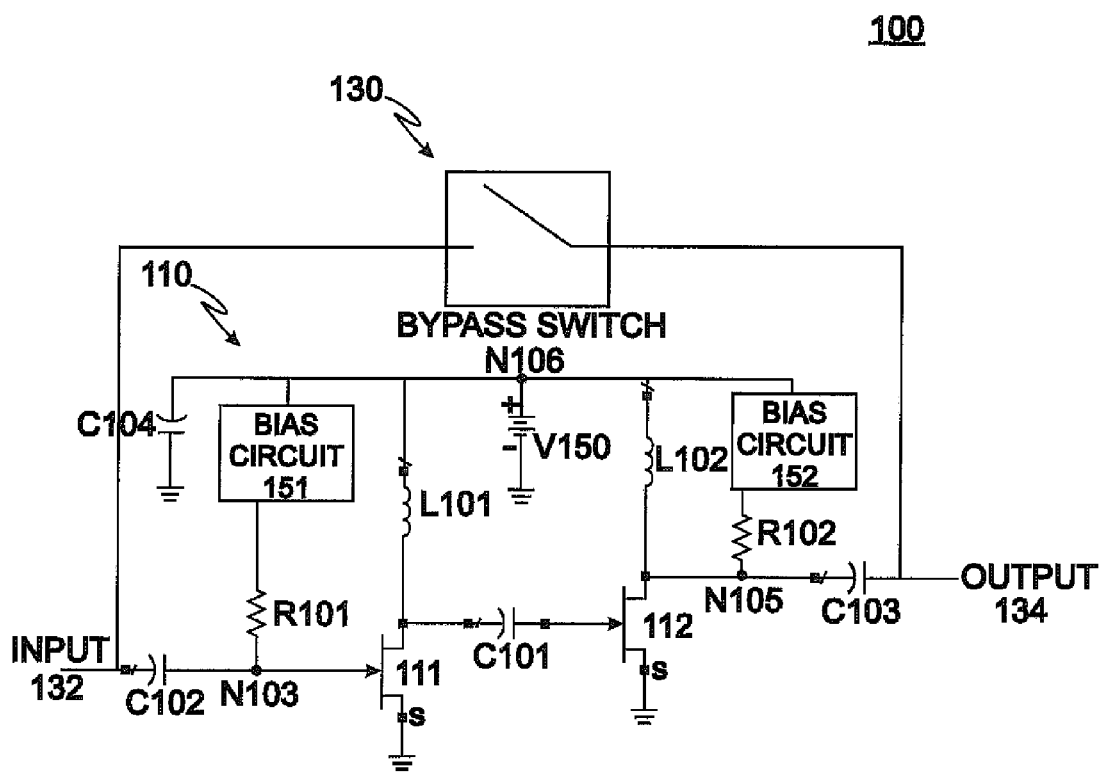
FIG. 1 is a block diagram illustrating a conventional amplifier circuit.
Figure 2:
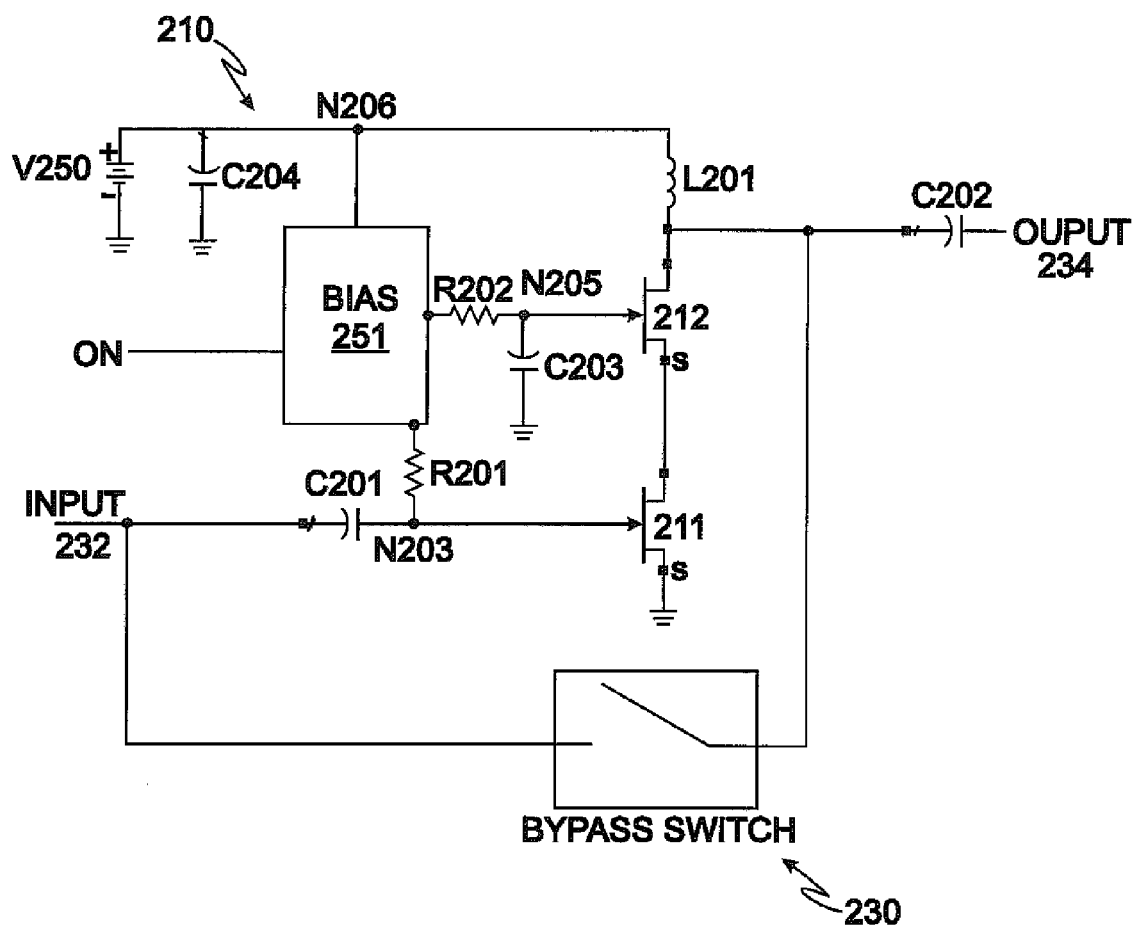
FIG. 2 is a block diagram illustrating a conventional amplifier circuit.

The combination of the resistance of the third transistor 413, the capacitors C405 and C406, and the inductor L401 also shifts resonance toward a lower frequency, which causes the dip in insertion loss of the bypass switch 430 to occur at a frequency outside the frequency of operation. The resonance frequency would otherwise be formed by the parasitic gate-drain capacitance and the drain inductor (e.g., first parasitic gate-drain capacitance Cgd1 and L101 in conventional amplifier circuit 110 of FIG. 1), resulting in the dip in insertion loss occurring within the frequency of operation.

Figure 5:
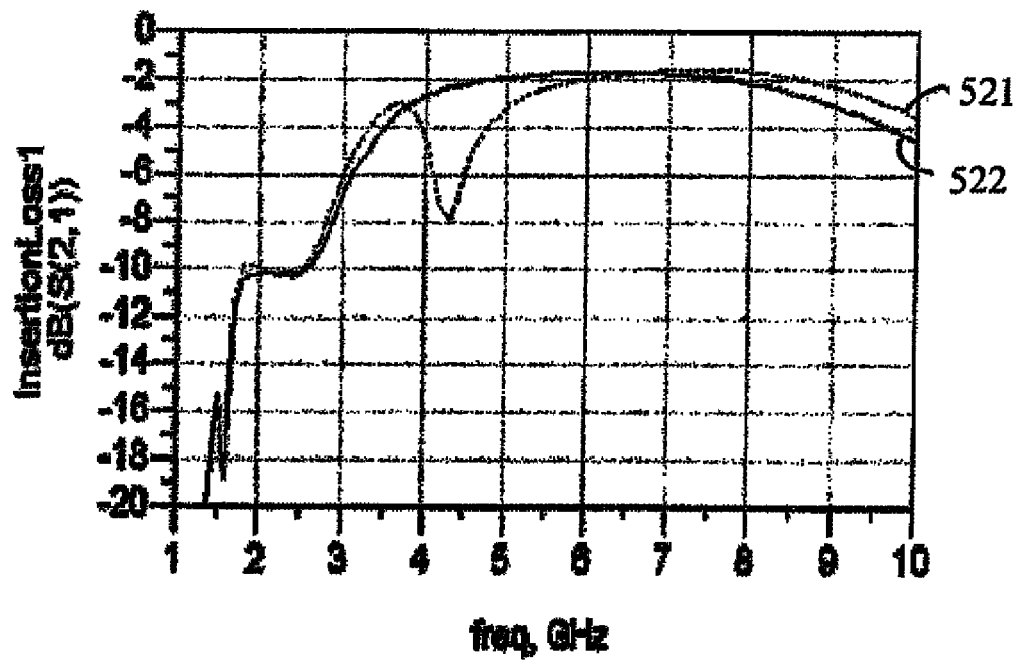
FIG. 5 is a graph illustrating insertion loss versus input frequency of an amplifier, according to a representative embodiment.

For example, FIG. 5 is a graph illustrating insertion loss versus input frequency of an amplifier, according to a representative embodiment. Curve 521 depicts insertion loss of a conventional bypass switch (e.g., bypass switch 130 of FIG. 1) as a function of frequency of the input RF signal. As shown, an approximately 5 dB dip in insertion loss occurs between about 3.5 GHz and 5.0 GHz. Assuming a representative operational frequency range of about 3 GHz and 10 GHz, for example, the dip in insertion loss depicted by curve 521 occurs with the operating frequency range, adversely affecting the attenuation properties of the bypass switch.

In comparison, curve 522 of FIG. 5 depicts insertion loss of a bypass switch according to a representative embodiment (e.g., bypass switch 430 of FIG. 4) as a function of frequency of the input RF signal. As shown, there is no dip in the insertion loss within the representative operating frequency range of about 3 GHz to 10 GHz, for example. Rather, the dip in insertion loss has been shifted to a lower frequency (e.g., about 1.5 GHz), which does not affect the attenuation properties of the bypass switch.

Figure 6:
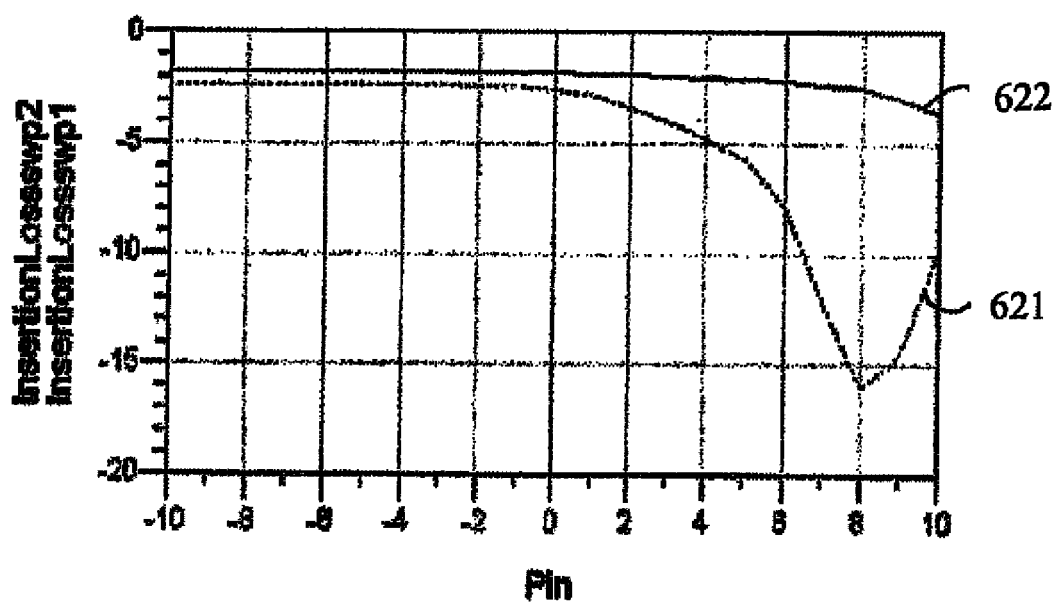
FIG. 6 is a graph illustrating insertion loss versus input power of an amplifier, according to a representative embodiment.

Likewise, FIG. 6 is a graph illustrating insertion loss versus input power Pin of an amplifier, according to a representative embodiment, where the input RF signal has a representative frequency of about 5.5 GHz. Curve 621 depicts insertion loss of a conventional bypass switch (e.g., bypass switch 130 of FIG. 1) as a function of input power Pin (or received signal strength) of the input RF signal. As shown, 1 dB gain compression occurs at approximately 2 dBm input power. In comparison, curve 622 depicts insertion loss of a bypass switch according to a representative embodiment (e.g., bypass switch 430 of FIG. 4) as a function of input power Pin of the input RF signal. As shown, the 1 dB gain compression occurs at a higher input power of 8 dBm.

In addition, the combination of the resistance of the third transistor 413, the capacitors C405 and C406, and the inductor L401 transforms the gate of first transistor 411 into a high reflection load across the frequency of operation. The high reflection load reduces the amount of power of the input RF signal that passes through the deactivated amplifier 410 (e.g., including the first and second transistors 411 and 412) in the bypass mode.

Accordingly, in the bypass mode of the depicted embodiment, performance of the amplifier circuit 400 is improved. For example, the amount of RF power passing through the deactivated amplifier 410 is reduced, no degradation in the bypass mode IP1 dB occurs, no dip in insertion loss of the bypass switch 430 occurs within the operating frequency range, and the bandwidth of the bypass switch 430 is extended.

In the amplify mode, the third transistor 413 is deactivated (turned off), e.g., in response to the inverted control signal CTRL. When it is turned off, the third transistor 413 acts as a small capacitor, e.g., having a capacitance value of about 0.1 pF in the representative circuit described above, which appears in series with the capacitors C405 and C406. The variable impedance circuit is therefore equivalent to three capacitors in series, and presents a very small capacitance and relatively high impedance in parallel with the inductor L401. The variable impedance circuit therefore does not interfere with gain, noise figure, input and output return loss, etc., of the amplifier 410, as long as the impedance of the variable impedance circuit is much higher than the impedance of the inductor L401.

According to the various embodiments, a common-source amplifier can be used as a low noise amplifier, for example, with bypass mode, without degradation of bypass mode IP1 dB and insertion loss characteristics. Also, a low voltage supply may be used (e.g., 1.4V as compared to 3.0V of a conventional amplifier circuit having a cascode configuration), and a broadband response is provided that cannot be achieved using the cascode configuration. Thus, the amplifier circuit provides large signal linearity in the bypass mode, while preventing the receiver circuit from becoming saturated by high power input RF signals.

In view of this disclosure it is noted that variant amplifier circuits can be implemented in keeping with the present teachings. Further, the various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. An amplifier circuit of a receiver for receiving a signal in a wireless network, the amplifying circuit comprising:
an amplifier comprising an amplifying transistor and a bypass transistor, the amplifying transistor having a gate connected to an input for receiving the signal and a source/drain connected to a voltage source through an inductance, and the bypass transistor having a gate connected to a control signal for activating the bypass transistor in a bypass mode and a source/drain connected between the voltage source and the source/drain of the amplifying transistor in parallel with the inductance; and
a switch connected in parallel with the amplifier between the input and an output, the switch being configured to activate in the bypass mode, enabling the received signal to bypass the amplifier,
wherein, in the bypass mode, a voltage at the source/drain of the amplifying transistor is lower when the bypass transistor is activated than when the bypass transistor is not activated, the lower source/drain RF voltage reducing unwanted harmonics from the amplifier.

2. The amplifier circuit of claim 1, wherein, when activated, the switch provides an insertion loss that attenuates signal strength of the received signal passing through the switch in the bypass mode.

3. The amplifier circuit of claim 2, wherein each of the amplifying transistor, the bypass transistor and the switch comprises a field effect transistor.

4. The amplifier circuit of claim 1, wherein, when activated, the bypass transistor shifts a resonance of the received signal toward a lower frequency.

5. The amplifier circuit of claim 1, wherein, when activated, the bypass transistor causes a high reflection load at the gate of the amplifying transistor, reducing an amount of power of the received signal passing through the amplifier in the bypass mode.

6. The amplifier circuit of claim 1, further comprising:
a processor configured to compare signal strength of the received signal to a threshold, and to generate the control signal to activate the bypass transistor and the switch when the signal strength of the received signal exceeds the threshold.

7. A radio frequency (RF) amplifying circuit comprising:
an amplifier connected between a signal input and a signal output, the amplifier being configured to amplify an RF signal received through the signal input and to output the amplified RF signal through the signal output in an amplify mode; and
a switch connected in parallel with the amplifier between the signal input and the signal output, the switch being configured to deactivate in the amplify mode and to activate in a bypass mode, and being further configured to attenuate the RF signal received through the signal input in the bypass mode,
wherein the amplifier comprises:
a first amplifying transistor having a first gate connected to the signal input, a first source connected to a ground voltage, and a first drain connected to a voltage source through an inductor, the inductor having an inductor impedance; and
a variable impedance circuit connected between the first drain and the voltage source in parallel with the inductor, the variable impedance circuit having a first impedance greater than the inductor impedance in the amplify mode and has a second impedance less than the inductor impedance in the bypass mode.

8. The amplifying circuit of claim 7, wherein the variable impedance circuit comprises a bypass transistor, a first capacitor and a second capacitor connected in series between the first drain and the voltage source.

9. The amplifying circuit of claim 8, wherein the bypass transistor is turned on in the bypass mode and turned off in the amplify mode.

10. The amplifying circuit of claim 9, further comprising:
a first bias circuit for biasing the first amplifying transistor in the amplify mode.

11. The amplifying circuit of claim 10, wherein the first circuit is activated by a control signal and the bypass transistor is deactivated by an inverse of the control signal in the amplify mode.

12. The amplifying circuit of claim 10, wherein the first bias circuit is deactivated by a control signal and the bypass transistor is activated by an inverse of the control signal in the bypass mode.

13. The amplifying circuit of claim 10, further comprising:
a second amplifying transistor having a second gate connected to the first drain, a second source connected to the ground voltage, and a second drain connected to the signal output; and
a second bias circuit for biasing the second amplifying transistor in the amplify mode.

14. An amplifying circuit of a receiver for receiving a radio frequency (RF) signal through a signal input, the amplifying circuit comprising:
a first field effect transistor (FET) comprising a first gate connected to the signal input, a first drain connected to a first node, and a first source connected to a ground voltage, the first node being connected to a second node through a first inductor and the second node being connected to a voltage source;
a second FET comprising a second gate connected to the first node, a second drain connected to a signal output, and a second source connected to the ground voltage, the first and second FETs amplifying the RF signal in an amplify mode;
a third FET comprising a third gate connected to an inverter which inverts a control signal, the third FET being connected in series between the first node through a first capacitor and the second node through a second capacitor, and in parallel to the first inductor; and
a bypass switch connected between the signal input and the signal output, the bypass switch being configured to activate in a bypass mode to attenuate the RF signal received from the signal input, and to prevent the first and second FETs from amplifying the RF signal.

15. The amplifing circuit of claim 14, wherein the third FET is turned off by the inverted control signal in the amplify mode, and acts as a third capacitor connected in series with the first and second capacitors.

16. The amplifing circuit of claim 15, wherein an impedance of the third FET and the first and second capacitors connected in series is greater than an impedance of the inductor when the third FET is turned off.

17. The amplifying circuit of claim 14, wherein the third FET is turned on by the inverted control signal in the bypass mode, and acts as a resistor connected in series with the first and second capacitors.

18. The amplifing circuit of claim 17, wherein an impedance of the third FET and the first and second capacitors connected in series is lower than an impedance of the inductor when the third FET is turned on.

19. The amplifing circuit of claim 18, wherein the inductor, in combination with the third FET and the first and second capacitors connected in series, transforms the first gate of the first FET into a high reflection load across a frequency of operation when the third FET is turned on.

20. The amplifing circuit of claim 18, wherein the lower impedance of the third FET and the first and second capacitors connected in series results in a lower voltage generated at the first node, the lower voltage driving the second FET.

* * * * *